United States Patent
Sharma et al.

(10) Patent No.: US 11,653,487 B2
(45) Date of Patent: May 16, 2023

(54) 4F2 DRAM CELL USING VERTICAL THIN FILM TRANSISTOR

(71) Applicant: Intel Corporation, Santa Clara, CA (US)

(72) Inventors: Abhishek Sharma, Hillsboro, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 936 days.

(21) Appl. No.: 16/013,798

(22) Filed: Jun. 20, 2018

(65) Prior Publication Data

US 2019/0393222 A1 Dec. 26, 2019

(51) Int. Cl.
*H01L 27/108* (2006.01)
*H01L 29/786* (2006.01)

(52) U.S. Cl.
CPC .. *H01L 27/10802* (2013.01); *H01L 27/10814* (2013.01); *H01L 27/10817* (2013.01); *H01L 27/10897* (2013.01); *H01L 29/78642* (2013.01)

(58) Field of Classification Search
CPC ......... H01L 29/78642; H01L 27/10802; H01L 27/10814; H01L 27/10817; H01L 27/10897
See application file for complete search history.

(56) References Cited

U.S. PATENT DOCUMENTS

| 9,276,092 B1 * | 3/2016 | Karda ............... H01L 29/66969 |
| 2013/0234242 A1 * | 9/2013 | Hwang ............ H01L 27/10885 257/330 |

* cited by examiner

*Primary Examiner* — Matthew L Reames
(74) *Attorney, Agent, or Firm* — Schwabe, Williamson & Wyatt P.C.

(57) ABSTRACT

Embodiments include a transistor device that comprises a gate electrode and a gate dielectric surrounding the gate electrode. In an embodiment, a source region may be below the gate electrode and a drain region may be above the gate electrode. In an embodiment, a channel region may be between the source region and the drain region. In an embodiment, the channel region is separated from a sidewall of the gate electrode by the gate dielectric. In an embodiment, a capacitor may be electrically coupled to the drain region.

12 Claims, 10 Drawing Sheets

4F2 DRAM CELL USING VERTICAL THIN FILM TRANSISTOR

TECHNICAL FIELD

Embodiments of the disclosure are in the field of semiconductor structures and processing and, in particular, to a $4F^2$ DRAM cell that is implemented with vertical thin film transistors (VTFTs).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

With respect to dynamic random access memory (DRAM), the drive to $4F^2$ scale has been obtained through the use of silicon channel vertical transistors. The formation of such transistors requires that the transistor be formed on the semiconductor substrate. The peripheral circuitry (e.g., sensing circuitry) also needs to be formed on the semiconductor substrate. Accordingly, real estate on the semiconductor substrate cannot be saved by stacking the silicon channel vertical transistors over the peripheral circuitry. Furthermore, silicon channel vertical transistors are not capable of meeting stringent low leakage requirements needed for DRAM applications.

DESCRIPTION OF THE EMBODIMENTS

Figures 1A, 1B:
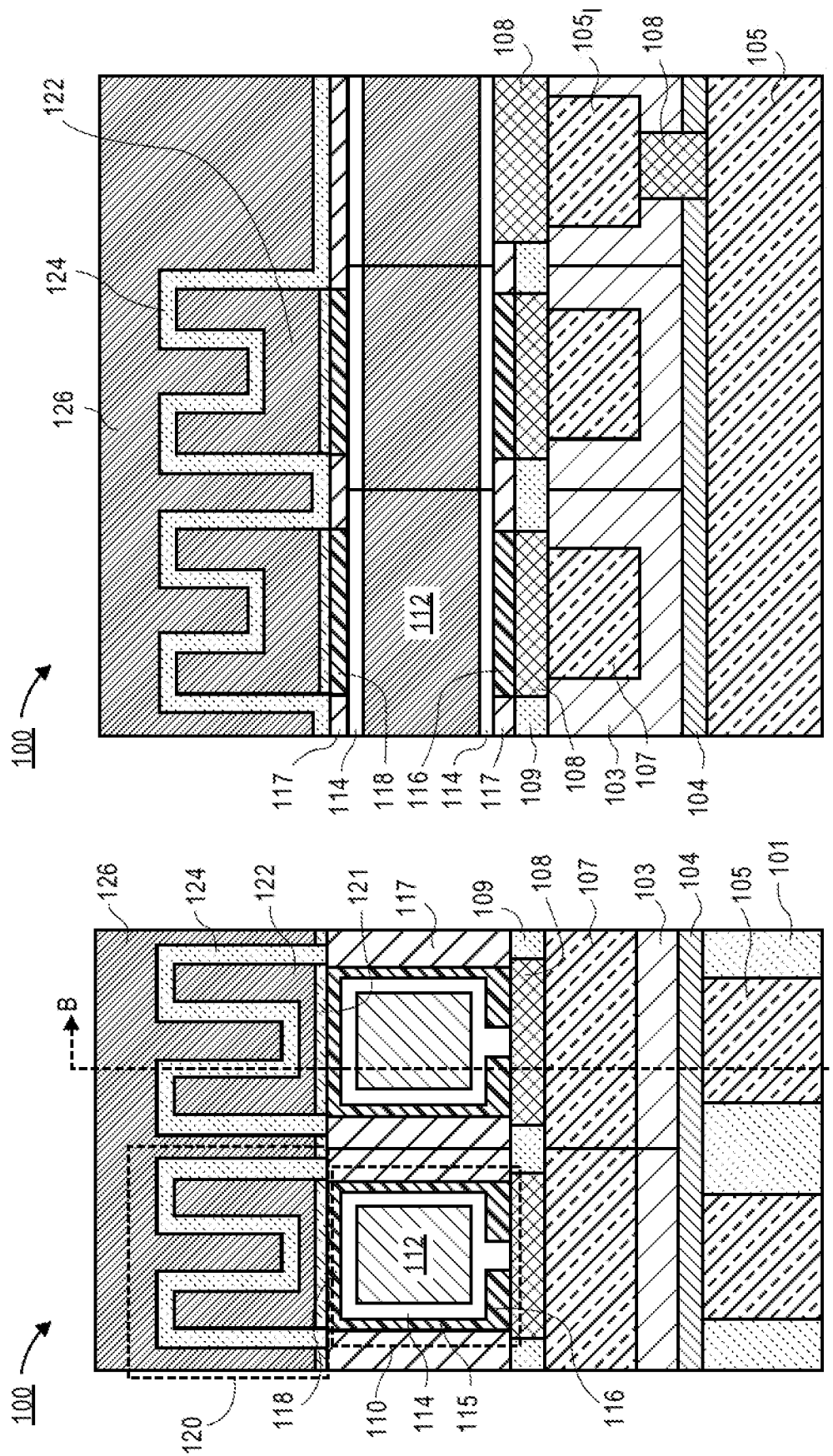
FIG. 1A is a cross-sectional illustration of a pair of vertical channel thin film transistors (VTFTs) for use in a dynamic random access memory (DRAM) cell along the bitline, in accordance with an embodiment.
FIG. 1B is a cross-sectional illustration of the pair of VTFTs for use in a DRAM cell along the wordline, in accordance with an embodiment.

Embodiments described herein comprise $4F^2$ DRAM cells that are implemented with vertical channel thin film transistors (VTFTs). In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, DRAM device scaling to the $4F^2$ node faces challenges in terms of providing low-leakage transistors within a desired footprint. Accordingly, embodiments described herein include vertical channel transistors with low leakage that may be integrated into the back end of line (BEOL) stack. Accordingly, embodiments described herein enable reduction in the footprint of DRAM devices by forming the transistors of the DRAM device in the ILD layers over the peripheral circuitry formed on the semiconductor substrate. Furthermore, embodiments described herein allow for low-leakage DRAM devices by integrating double wall three-dimensional (DW3D) capacitors.

Referring now to FIG. 1A, a cross-sectional illustration of a DRAM cell 100 along the bitline 107 is shown in accordance with an embodiment. In an embodiment, the DRAM cell 100 may comprise vertical channel thin film transistors VTFTs 110. In an embodiment, the VTFTs 110 may comprise a gate electrode 112 that is surrounded by a gate dielectric 114. In an embodiment, the gate dielectric 114 may surround top surfaces, bottom surfaces, and sidewall surfaces of the gate electrode 112. In an embodiment, the VTFTs 110 may comprise a source region 116 and a drain region 118. The source region 116 may be separated from the drain region 118 by a channel region 115 formed along sidewalls of the gate electrode 112. In an embodiment, the source region 116, the drain region 118 and the channel region 115 are separated from the gate electrode 112 by the gate dielectric 114.

In an embodiment, the source region 116, the drain region 118, and the channel region 115 may be formed with any suitable semiconductor material. In an embodiment, the semiconductor material may be amorphous, polycrystalline, or single crystalline. In an embodiment, the source region 116, the drain region 118, and the channel region 115 may comprise semiconductor materials such as, but not limited to, ZnO, $Al_2O_5Zn_2$ aluminum doped ZnO (AZO), InZnO (IZO), indium tin oxide (ITO), InZnO, $In_2O_3$, $Ga_2O_3$, InGaZnO, semiconductor materials comprising other III-V materials, combinations (e.g., alloys or stacked layers) of semiconductor materials, and the like).

In an embodiment, the gate dielectric 114 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 114 to improve its quality when a high-k material is used.

It is to be appreciated that since the VTFT 110 is a thin-film transistor, the VTFT 110 does not need to be formed on a single crystalline semiconductor substrate. Accordingly, the VTFT 110 may be fabricated in the back end of line (BEOL) stack. This is particularly advantageous because it allows for space savings on the underlying semiconductor substrate. For example, the peripheral circuitry for the DRAM device may be formed below the VTFTs 110 on the underlying semiconductor substrate (as will be described in greater detail below with respect to FIG. 2).

In order to provide protection for the channel regions 115 from subsequent processing operations, the channel regions 115 may be covered by a protective sealant 117. The sealant may be a dielectric material that provides protection to the channel regions 115 from processes that may reduce the performance of the channel region (e.g., by providing unwanted dopants to the channel region 115). In an embodiment, the protective sealant 117 may be any suitable dielectric material. For example, the sealant 117 may comprise oxides, nitrides, doped oxides, doped nitrides, or the like. In an embodiment, the sealant 117 may comprise oxides such as, but not limited, to oxides of one or more of Al, Zn, Zr, Hf, Al, Ti, Y, and Si. In an embodiment, oxides may include dopants, such as, but not limited to hafnium. In an embodiment, the sealant 117 may comprise nitrides such as, but not limited to, nitrides of one or more of silicon, aluminum, and titanium. In an embodiment, nitrides may include dopants, such as, but not limited to hafnium.

In an embodiment, the gate electrode 112 may be electrically coupled to the wordline 105 that runs substantially orthogonal to the bitlines 107. As illustrated in the cross-sectional illustration along the wordline 105 shown in FIG. 1B, the connection between the gate electrode 112 and the wordline 105 may be formed outside of a footprint of the DRAM cell 100 (i.e., not directly below a transistor 110). In an embodiment, the gate electrode 112 may be electrically coupled to the wordline 105 by a via 108, an intermediate wordline $105_I$ (that runs parallel to the bitlines 107 outside of the footprint of the DRAM cell 110), and a second via 108 between the intermediate wordline $105_I$ and the wordline 105. In an embodiment, the gate electrode 112 may comprise a wide range of materials, such as polysilicon, silicon nitride, silicon carbide, or various suitable metals or metal alloys, such as Al, W, Ti, Ta, Cu, TiN, or TaN, for example. In an embodiment, the wordlines 105 and the bitlines 107 may be composed of a conductive material such as, but not limited to, Cu, Al, Ti, Zr, Hf, V, Ru, Co, Ni, Pd, Pt, W, Ag, Au or alloys thereof.

In an embodiment, the bitlines 107 may be formed in an interlayer dielectric (ILD) layer 103. In an embodiment, the bitlines 107 may run substantially orthogonal to the gate electrodes 112 of the VTFTs 110. In an embodiment, the wordlines 105 may be formed in an ILD 101 below the ILD 103 in which the bitlines 107 are formed. In an embodiment, the wordlines 105 may run substantially orthogonal to the bitlines 107. In an embodiment, an etch stop layer 104 may separate ILD 103 from ILD 101. In an embodiment, the bitlines 107 may be electrically coupled to the source region 116 of the VTFTs 110. In an embodiment, the bitlines 107 may be electrically coupled to the source region 116 of the VTFTs 110 by vias 108 through an etch stop layer 109.

In an embodiment, the drain region 118 of the VTFTs 110 may be electrically coupled to the capacitor 120. The drain region 118 may be electrically coupled to the storage node 122 of the capacitor 120. In some embodiments, a metal sealant 121 may electrically couple the drain region 118 to the storage node 122. For example, the metal sealant 121 may be a material that protects the semiconductor drain region 118 from subsequent processing that may otherwise degrade the performance of the drain region 118. For example, the metal sealant 121 may comprise one or more conductive material such as, but not limited to Pt, Ir, Ru, W, other metals and their alloys, and highly doped silicon.

In an embodiment, the capacitor 120 may be any suitable capacitor that provides a desired performance for a given application. In a general embodiment, the capacitor 120 may comprise a storage node 122 and a top electrode 126. The storage node 122 may be separated from the top electrode 126 by a dielectric layer 124. In an embodiment, the capacitance of the capacitor 120 may be increased by increasing the total area of the interface between the storage node 122 and the top electrode 126. According to an embodiment, an interdigitated interface may be used to increase the capacitance of the capacitor 120. For example, in FIG. 1A and FIG. 1B, each storage node 122 is illustrated as having a plurality of vertical protrusions that interdigitate with protrusions of the top electrode 122. Such a configuration may be referred to as a double wall three dimensional (DW3D) capacitor 120. While a DW3D capacitor 120 is illustrated in FIGS. 1A and 1B, other capacitor configurations may also be used in accordance with embodiments described herein. In an embodiment, a single top electrode 126 may be used by a plurality of capacitors 120. However, it is to be appreciated that the embodiments may also include a plurality of top electrodes 126, where each of the top electrodes 126 is used in one or more capacitors 120. In an embodiment, the top electrode 126 may be electrically coupled to a regulated analog voltage generator. The regulated analog voltage generator may supply optimal voltage to the top electrode 126 to improve reliability of the capacitor 120.

In an embodiment, the leakage of the capacitor 120 may also be minimized by fabricating the capacitor with materials that optimize performance. For example, the dielectric layer 124 may be formed with one or more high-k dielectric materials. For example, the dielectric layer 124 may comprise one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the dielectric layer 124 to improve its quality. In an embodiment, the storage node 122 and the top electrode 124 may comprise a wide range of materials, such as polysilicon, silicon nitride, silicon carbide, or various suitable metals or metal alloys, such as Al, W, Ti, Ta, Cu, TiN, or TaN, for example.

Figure 2:
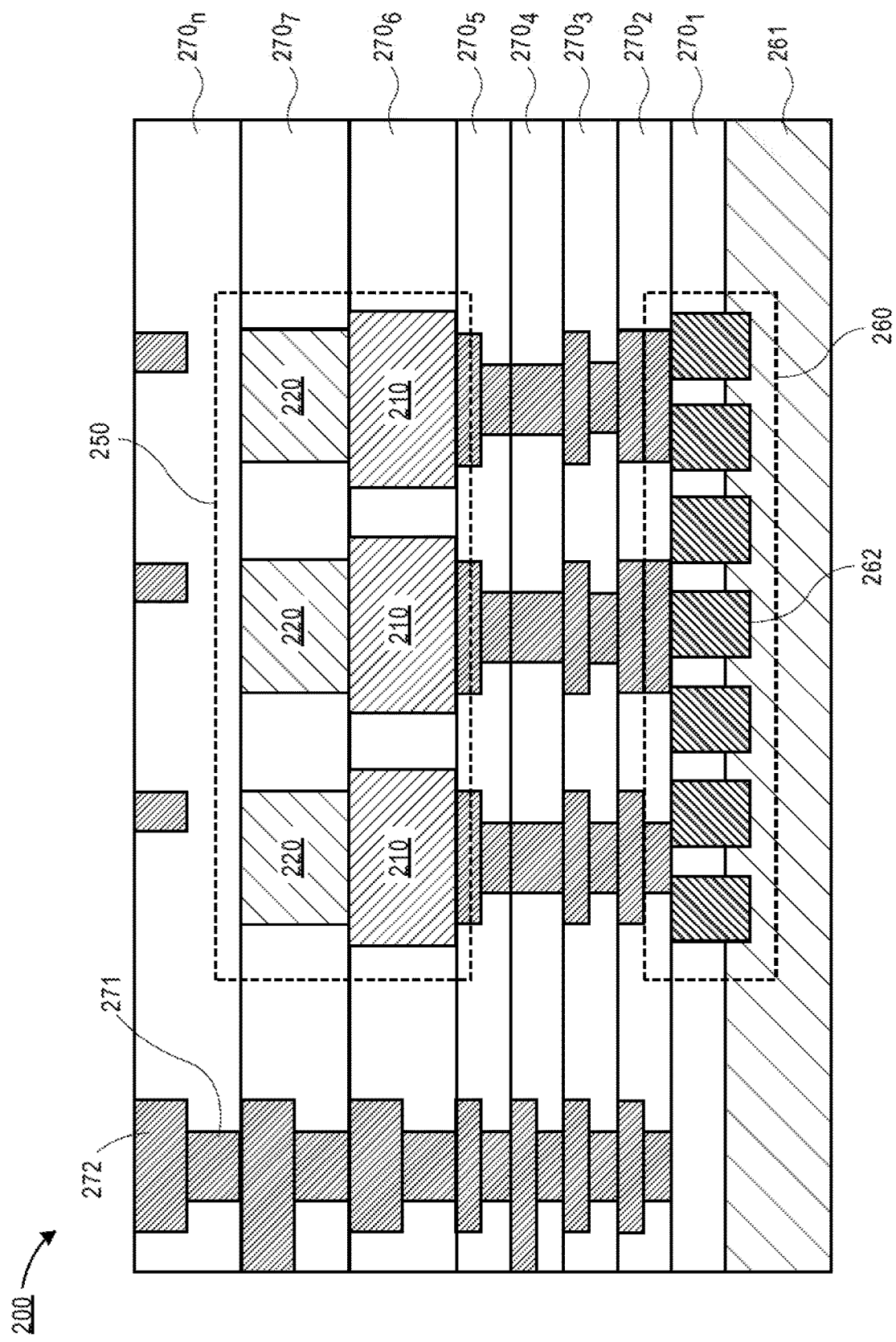
FIG. 2 is a cross-sectional illustrations of a portion of a DRAM device with a plurality of VTFTs formed in interlayer dielectric (ILD) layers above sensing circuits formed on a semiconductor substrate, in accordance with an embodiment.

Referring now to FIG. 2, a cross-sectional illustration of a memory device 200 is shown, in accordance with an embodiment. In an embodiment, the memory device 200 may be fabricated on a substrate 261. A BEOL stack comprising a plurality of ILDs 270 may be formed over the substrate 261. In an embodiment, an underlying substrate 261 represents a general workpiece object used to manufacture integrated circuits. The substrate 261 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The substrate 261, depending on the stage of manufacture, often includes transistors, integrated circuitry, and the like. The substrate 261 may also include semiconductor materials, metals, dielectrics, dopants, and other materials commonly found in semiconductor substrates. For example, peripheral circuitry 260 may be formed on and/or over the substrate 261. In an embodiment, the peripheral circuitry 260 may comprise one or more transistor devices 262 used for sensing circuitry of the DRAM devices.

In an embodiment, memory device 200 may comprise a plurality of DRAM cells 250 that are formed in the BEOL stack of the memory device 200. In an embodiment, the BEOL stack may comprise a plurality of interlayer dielectric (ILD) layers 270. For example, in FIG. 2, eight ILD layers $270_1$-$270_n$ are illustrated. However, embodiments may include any number of ILD layers 270, depending on the needs of the memory device. In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof.

In an embodiment, as is also used throughout the present description, metal lines or interconnect line material (and via material) used to form interconnects 272 and vias 271 is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

As illustrated in FIG. 2, embodiments disclosed herein provide significant reductions in the substrate 261 real estate needed to be dedicated to components for the memory device 200. Particularly, the DRAM cells 250 (which may include a plurality of VTFT 210 and capacitor 220 pairs) may be formed in BEOL stack directly above peripheral circuitry 260 needed to operate the DRAM cells 250. In the particular embodiment illustrated in FIG. 2, the VTFTs 210 are formed in the sixth ILD $270_6$ and the capacitors 220 are formed in the seventh ILD $270_2$. However, it is to be appreciated that the VTFTs 210 and the capacitors 220 may be formed in any layer of the BEOL stack. Furthermore, it is to be appreciated that the VTFTs 210 and the capacitors 220 illustrated in FIG. 2 are simplified in order to not obscure embodiments described herein. As such, it is to be appreciated that embodiments may include VTFTs 210 and capacitors 220 that are formed in accordance with more detailed descriptions of VTFTs and capacitors described herein.

Figure 3A:
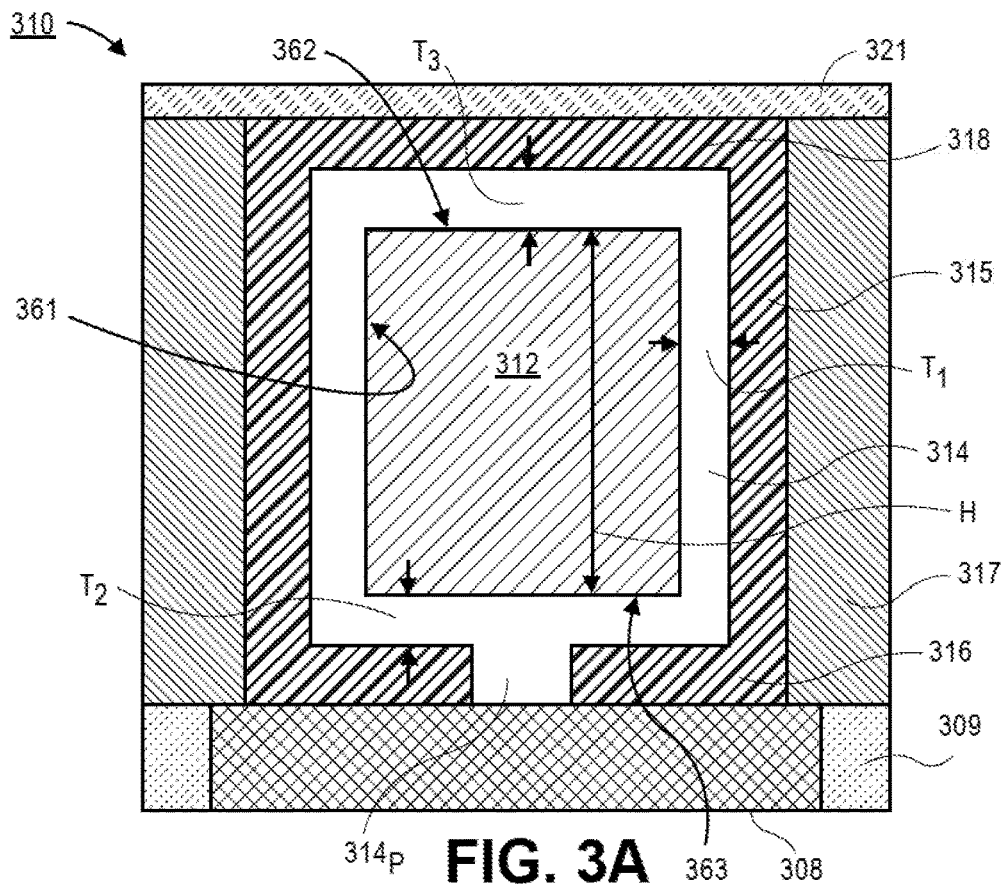
FIG. 3A is a cross-sectional illustration of a VTFT, in accordance with an embodiment.

Referring now to FIG. 3A, a cross-sectional illustration of a VTFT 310 is shown, in accordance with an embodiment. In an embodiment VTFT 310 may include a gate electrode 312 with a gate dielectric 314 surrounding an entire perimeter of the gate electrode 312. For example, the gate dielectric 314 may be formed over an uppermost surface 362 of the gate electrode 312, sidewall surfaces 361 of the gate electrode 312, and a lowermost surface 363 of the gate electrode 312.

In the illustrated embodiment, the gate electrode 312 is illustrated as having a substantially rectangular cross-section. However, it is to be appreciated that the cross-section of the gate electrode 312 may be any shape, depending on the needs of the device. For example, while the sidewall surfaces 361 are illustrated as being substantially vertical, it is to be appreciated that the sidewall surfaces 361 may comprise a taper, a slope, or any other non-planar and/or non-vertical profile. While not limited to any particular dimensions, the gate electrode 312 may have a height H between 5 nm and 200 nm. In an embodiment, the gate electrode 312 may have a height H that allows the VTFT 310 to be formed in a single ILD layer. In other embodiments, the VTFT 310 may be formed in more than one ILD layer.

In an embodiment, a thickness of the gate electrode may be substantially uniform. For example, the thickness $T_1$ along the sidewalls 361 of the gate electrode 312, the thickness $T_2$ along the lowermost surface 363 of the gate electrode 312, and the thickness $T_3$ along an uppermost surface 362 of the gate electrode 312 may be substantially equal. However, as will be described in greater detail below, embodiments are not limited to a gate dielectric 314 that has a substantially uniform thickness. Furthermore, in an embodiment, a protrusion $314_P$ from the gate dielectric 314 may extend away from the gate electrode 312 and pass through a portion of the source region 316. In some embodiments, the thickness of the protrusion may be controlled to provide a desired protection from parasitic coupling between the bitline and the wordline (i.e., the gate electrode 312).

In an embodiment, a semiconductor material may be formed around surfaces of the gate dielectric 314 opposite from surfaces of the gate dielectric 314 that are contacting the gate electrode 312. In an embodiment, the semiconductor material may comprise a source region 316 formed below a lowermost surface 363 of the gate electrode 312 and a drain region 318 formed above the uppermost surface 362 of the gate electrode 312. In an embodiment, a channel region 315 may be formed between the source region 316 and the drain region 318. For example, the channel region 315 may be formed along the sidewall surfaces 361 of the gate electrode 312.

In an embodiment, the semiconductor materials may need protection from processing environments used to form subsequent features in the device. Accordingly, in some embodiments a metal sealant 321 may be formed over the drain region 318. Similarly, a protective sealant 317 may be formed over the channel region 315 to passivate the lateral surfaces of the semiconductor material.

Figure 3B:
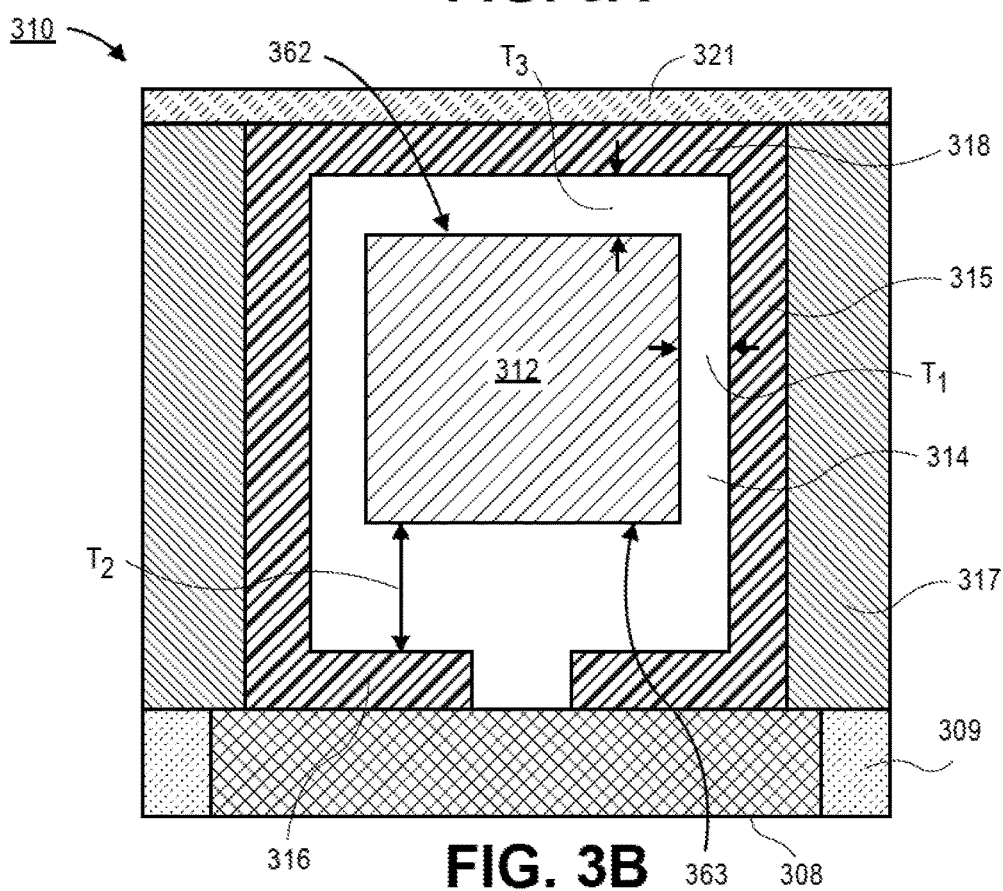
FIG. 3B is a cross-sectional illustration of a VTFT where a gate dielectric below the gate electrode is thicker than a gate dielectric above the gate electrode, in accordance with an embodiment.

Referring now to FIG. 3B, a cross-sectional illustration of a VTFT 310 is shown in accordance with an additional embodiment. The VTFT 310 is substantially similar to the VTFT described with respect to FIG. 3A, with the exception that the gate dielectric 314 does not have a uniform thickness. For example, a thickness $T_2$ of the gate dielectric 314 below the lowermost surface 363 of the gate electrode 312 may be greater than thicknesses $T_1$ and $T_3$ of the gate dielectric 314 along sidewalls 361 of the gate electrode 312 and over the uppermost surface 362 of the gate electrode, respectively. Increasing the thickness $T_2$ may reduce bitline to wordline (i.e., the gate electrode 312) coupling capacitance.

Figure 3C:
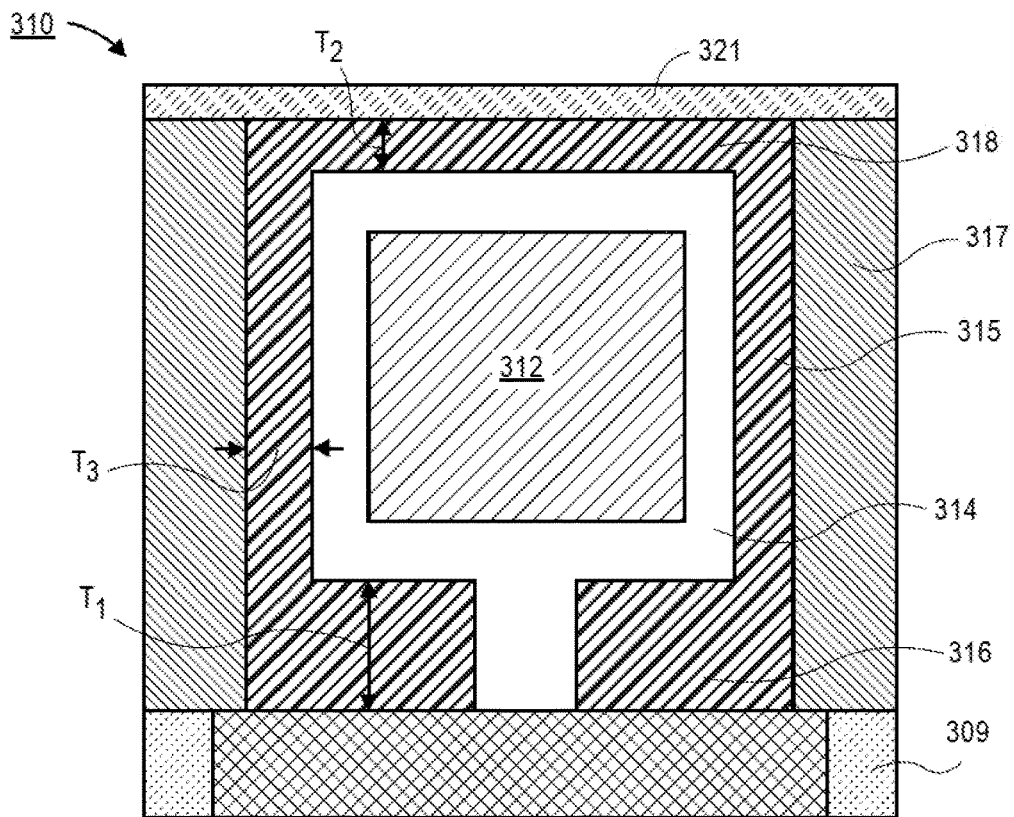
FIG. 3C is a cross-sectional illustration of a VTFT where a source region has a different thickness than a drain region, in accordance with an embodiment.

Referring now to FIG. 3C, a cross-sectional illustration of a VTFT 310 is shown, in accordance with an additional embodiment. The VTFT 310 illustrated in FIG. 3C is substantially similar to the VTFT illustrated in FIG. 3A, with the exception that the source region 316 has a thickness $T_1$ that is different than a thickness $T_2$ of the drain region 318. In an embodiment, the thickness $T_1$ may be greater than the thickness $T_2$. However, it is to be appreciated that the thickness $T_2$ may also be equal to or greater than the thickness $T_1$. In an embodiment, a thickness $T_3$ of the channel region 315 may be substantially equal to, less than, and/or greater than one or both of the first thickness $T_1$ and the second thickness $T_2$.

Figure 3D:
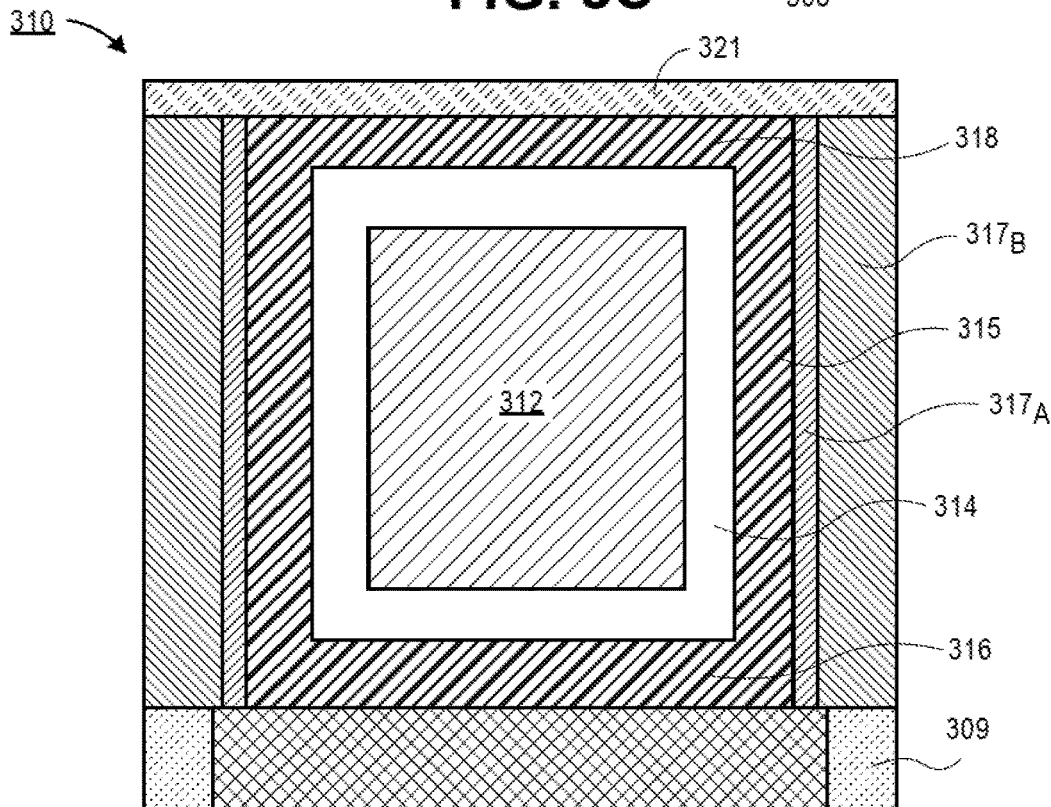
FIG. 3D is a cross-sectional illustration of a VTFT where the channel is covered by a sealant that comprises a bilayer, in accordance with an embodiment.

Referring now to FIG. 3D, a cross-sectional illustration of a VTFT 310 is shown, in accordance with an additional embodiment. In an embodiment, the VTFT 310 illustrated in FIG. 3D is substantially similar to the VTFT 310 illustrated in FIG. 3A, with the exception that the protective sealant 317 is a bilayer. For example, the protective sealant 317 may comprise a first layer $317_A$ and a second layer $317_B$. While a bilayer protective sealant 317 is illustrated, it is to be appreciated that the protective sealant 317 may comprise any number of layers, depending on the device. FIG. 3D also differs from FIG. 3A in that the source region 316 is continuous below the gate electrode 312. For example, the gate dielectric 314 may not have a protrusion that extends down and contacts the via 308. It is to be appreciated that a continuous source region 316 may be combined with any of the other embodiments described herein, and a continuous source region 316 is not limited to be used in configurations where the protective sealant 317 comprises a bilayer.

Figure 3E:
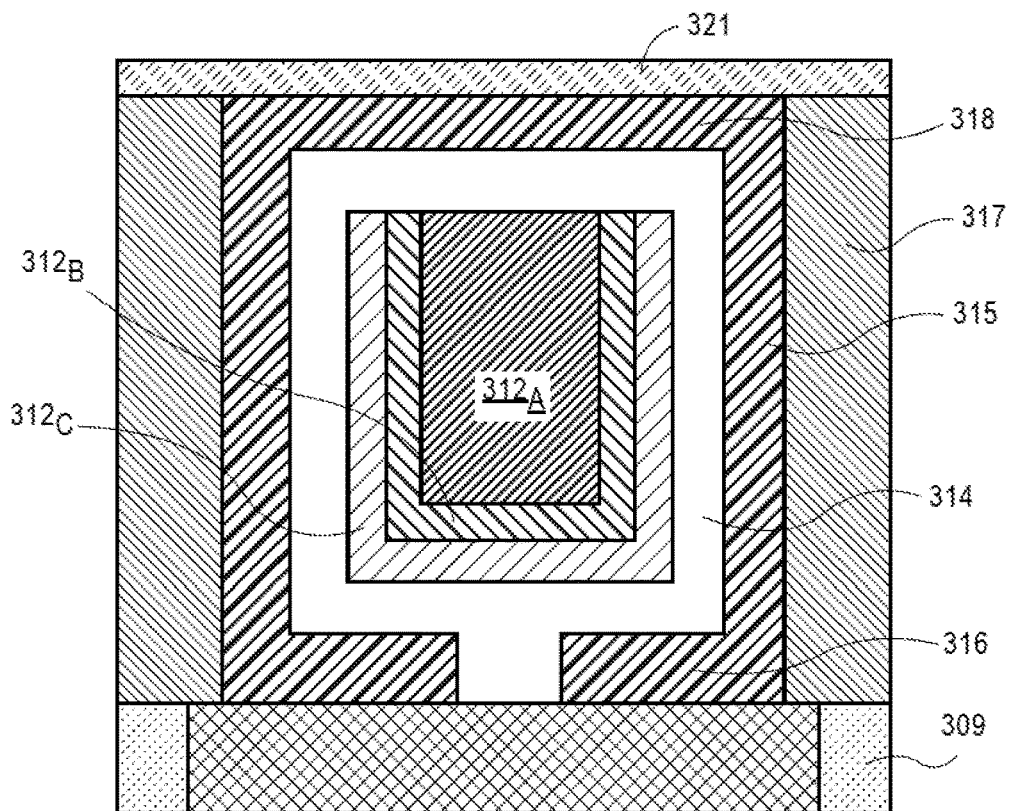
FIG. 3E is a cross-sectional illustration of a VTFT where the gate electrode comprises a plurality of layers, in accordance with an embodiment.

Referring now to FIG. 3E, a cross-sectional illustration of a VTFT 310 is shown, in accordance with an additional embodiment. In an embodiment, the VTFT 310 illustrated in FIG. 3E is substantially similar to the VTFT 310 illustrated in FIG. 3A, with the exception that the gate electrode 312 is comprised of a plurality of layers. For example, the gate electrode 312 may be formed of a plurality of conformally deposited layers. Accordingly, the layers may form a u-shaped pattern, as shown in FIG. 3E. For example, a first gate electrode layer $312_A$ may be formed at the center of the gate electrode 312, a second gate electrode layer $312_B$ may be formed in a u-shape around the first gate electrode layer $312_A$, and a third gate electrode layer $312_C$ may be formed in a u-shape around the second gate electrode layer $312_B$. While three gate electrode layers are shown, it is to be appreciated that any number of gate electrode layers may be used, depending on the device.

Figure 3F:
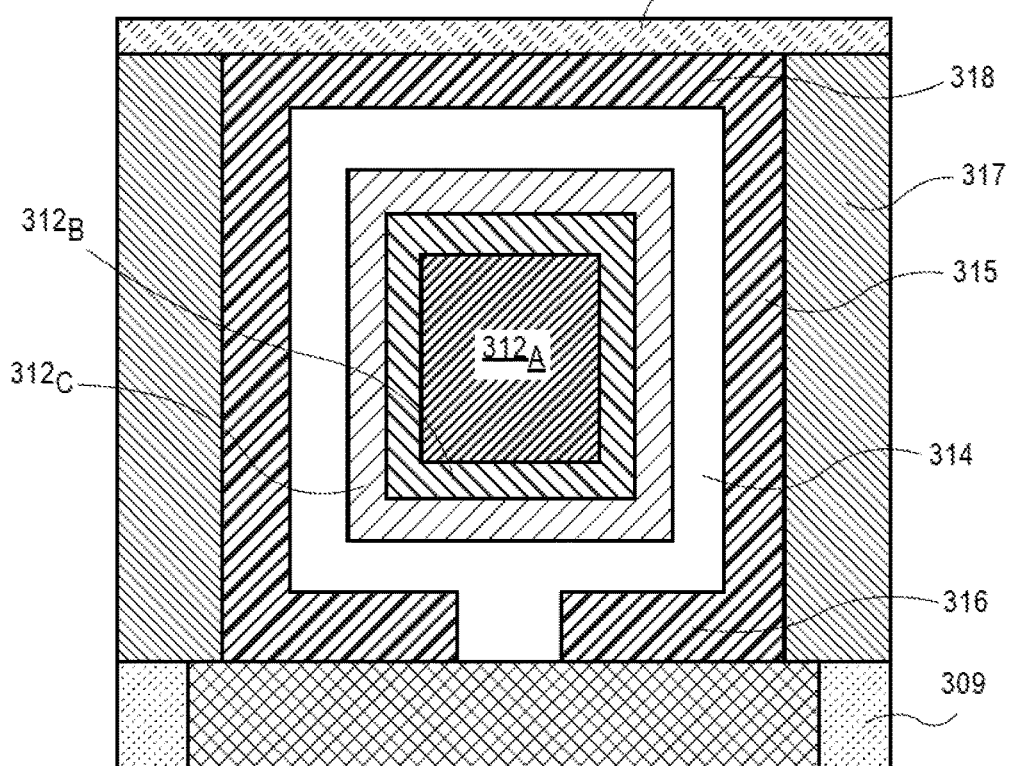
FIG. 3F is a cross-sectional illustration of a VTFT where the gate electrode comprises a plurality of concentric layers, in accordance with an embodiment.

Referring now to FIG. 3F a cross-sectional illustration of a VTFT 310 is shown, in accordance with an additional embodiment. In an embodiment, the VTFT 310 illustrated in FIG. 3F is substantially similar to the VTFT 310 illustrated in FIG. 3E, with the exception that the plurality of gate electrode layers $312_{A-C}$ are formed in a concentric configuration. While a u-shaped configuration and a concentric configuration are disclosed, it is to be appreciated that embodiments may also include a gate electrode with any configuration of layers. For example, the layers may be planar layers that are stacked over each other.

Figure 4A:
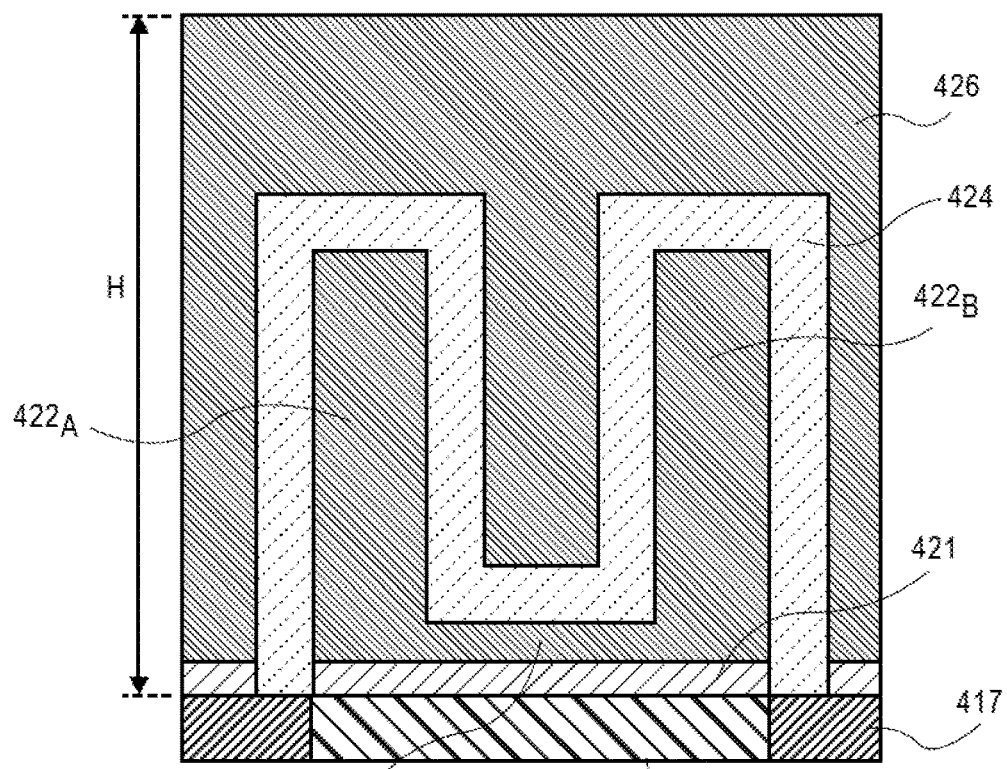
FIG. 4A is a cross-sectional illustration of a capacitor with an interdigitated surface between the storage node and the top electrode, in accordance with an embodiment.

Referring now to FIG. 4A, a cross-sectional illustration of a capacitor 420 that may be used in a memory device such as those disclosed herein is shown, in accordance with an embodiment. In an embodiment, the capacitor 420 may comprise a storage node 422, a dielectric layer 424, and a top electrode 426. In an embodiment, the storage node 422 may comprise a plurality of protrusions $422_A$ and $422_B$. The use of protrusions $422_A$ and $422_B$ increases the surface area of the interface between the top electrode 426 and the storage node 422 without increasing the footprint of the capacitor. In the illustrated embodiment, two protrusions $422_A$ and $422_B$ are shown, but it is to be appreciated that any number of protrusions may be used. Furthermore, it is to be appreciated that the protrusions of the storage node 422 may also be formed in a third dimension (as shown in FIG. 1B) to further increase the charge storage capability of the capacitor 410.

In an embodiment, the capacitor 420 may have a height H that allows the capacitor 420 to be formed in a single ILD layer. In additional embodiments, the capacitor 420 may be formed in more than ILD layer. In an embodiment, the capacitor 420 may have a height H that is between 20 nm and 200 nm.

Figure 4B:
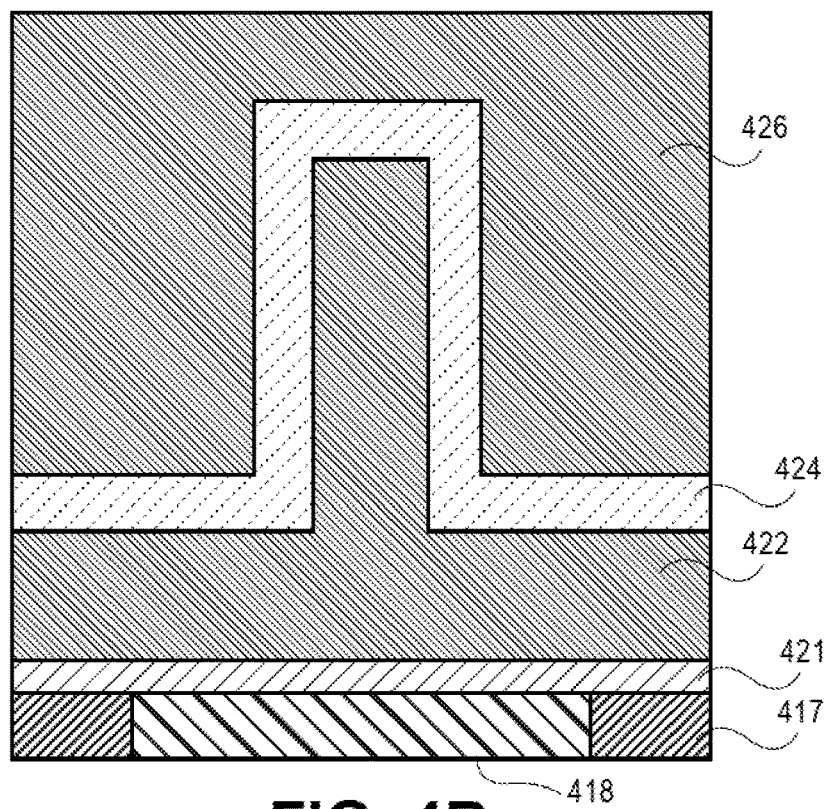
FIG. 4B is a cross-sectional illustration of a capacitor with an interdigitated surface between the storage node and the top electrode, in accordance with an additional embodiment.

Referring now to FIG. 4B, a cross-sectional illustration of a capacitor 420 is shown in accordance with an additional embodiment. The capacitor 420 illustrated in FIG. 4B is substantially similar to the capacitor 420 illustrated in FIG. 4A, with the exception that capacitor 420 only comprises a single protrusion.

Figure 4C:
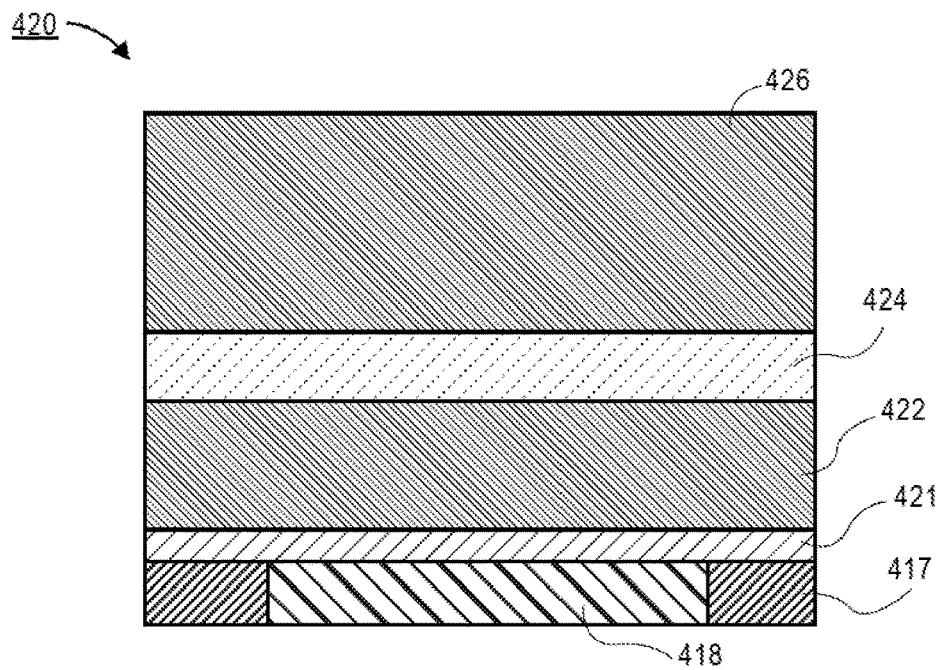
FIG. 4C is a cross-sectional illustration of a parallel plate capacitor, in accordance with an embodiment.

Referring now to FIG. 4C, a cross-sectional illustration of a capacitor 420 is shown in accordance with an additional embodiment. The capacitor 420 illustrated in FIG. 4C is substantially similar to the capacitor 420 illustrated in FIG. 4A, with the exception that capacitor 420 includes a storage node 422 that does not comprise any protrusions.

Figure 4D:
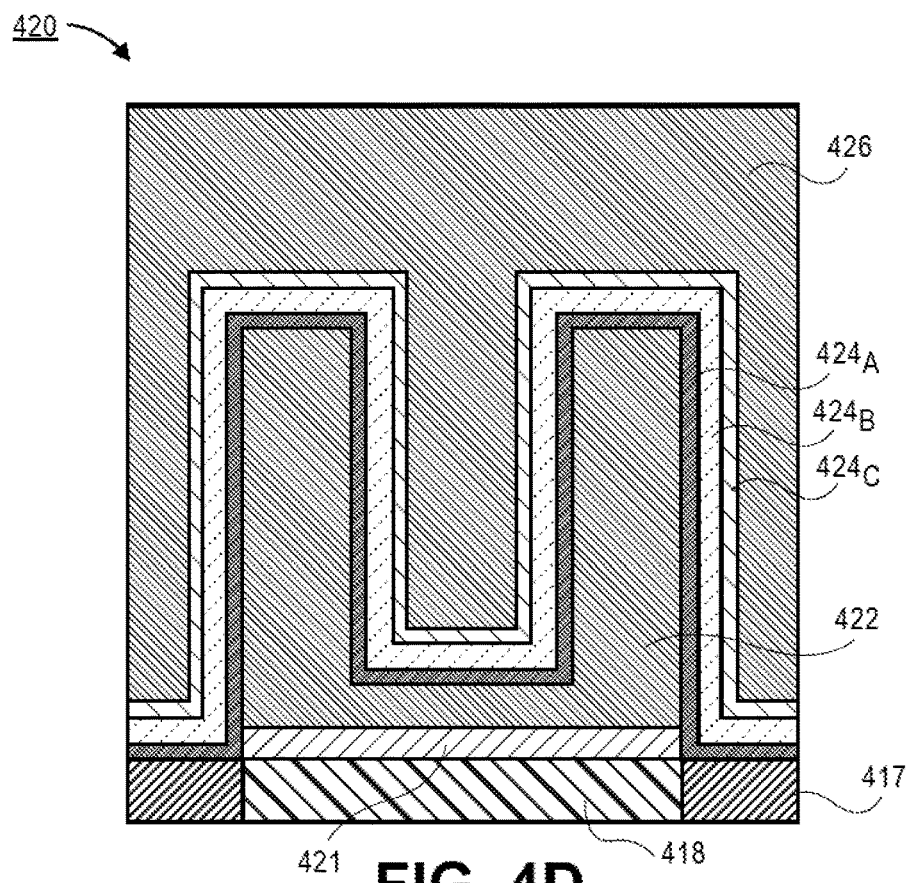
FIG. 4D is a cross-sectional illustration of an interdigitated capacitor, where the dielectric comprises a multilayer stack, in accordance with an embodiment.

Referring now to FIG. 4D, a cross-sectional illustration of a capacitor 420 is shown in accordance with an additional embodiment. The capacitor 420 illustrated in FIG. 4D is substantially similar to the capacitor 420 illustrated in FIG. 4A, with the exception that the dielectric layer 424 comprises a multi-layer stack. In the illustrated embodiment, the dielectric layer 424 is a tri-layer stack that comprises a first layer $424_A$, a second layer $424_B$, and a third layer $424_C$. In an embodiment, the first layer $424_A$, the second layer $424_B$ and the third layer $424_C$ may comprise three different materials. In some embodiments, the tri-layer stack may comprise two different material layers formed in an ABA pattern. While a tri-layer stack is illustrated in FIG. 4D, it is to be appreciated that the dielectric layer 424 may comprise a stack of any number of different dielectric materials.

Figures 5A, 5B, 5C:
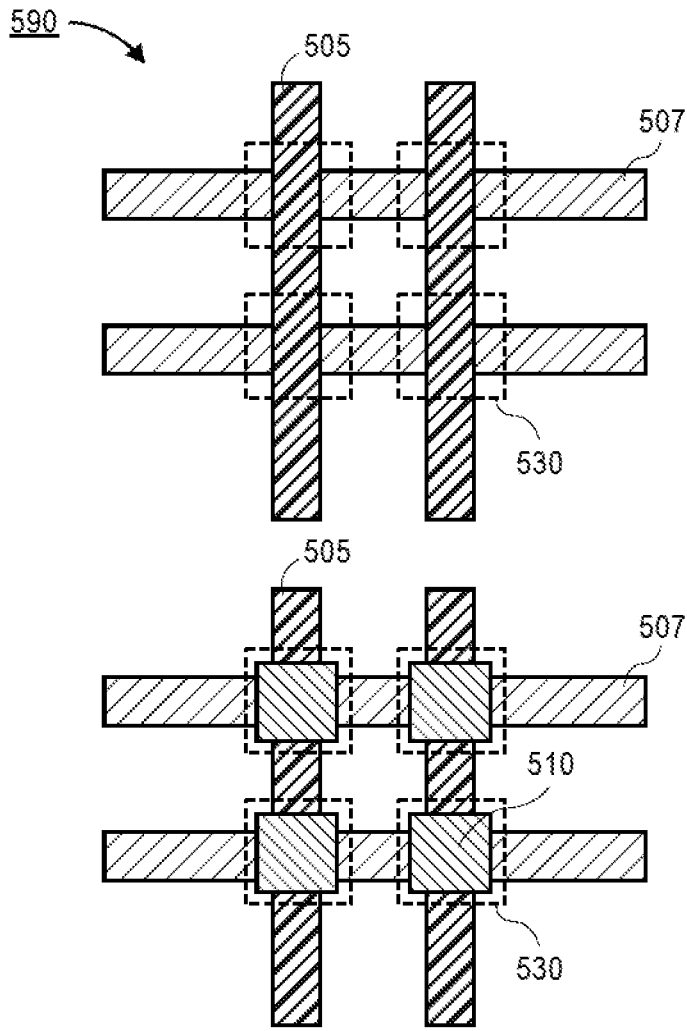
FIG. 5A is a plan view illustration of the wordlines and bitlines of a DRAM cell, in accordance with an embodiment.
FIG. 5B is a plan view illustration of the wordlines, bitlines, and transistors of a DRAM cell, in accordance with an embodiment.
FIG. 5C is a plan view illustration of the wordlines, bitlines, transistors, and capacitors of a DRAM cell, in accordance with an embodiment.

Referring now to FIGS. 5A-5C, plan view illustrations of a DRAM cell 590 is shown, in accordance with an embodiment. In FIGS. 5A-5C, the structures are simplified and some components may be omitted in order to not obscure embodiments described herein. Referring now to FIG. 5A, a plan view illustration of the wordlines 507 and the bitlines 505 are shown, in accordance with an embodiment. As illustrated, the DRAM cell 590 may comprise a pair of wordlines 507 that are substantially orthogonal to the bitlines 505. In an embodiment, a DRAM component 530 may be located at the intersection of each bitline 505 and wordline 507. For example, each DRAM component 530 may comprise a VFTF 510 (as illustrated in FIG. 5B) and a capacitor 520 (as illustrated in FIG. 5C).

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
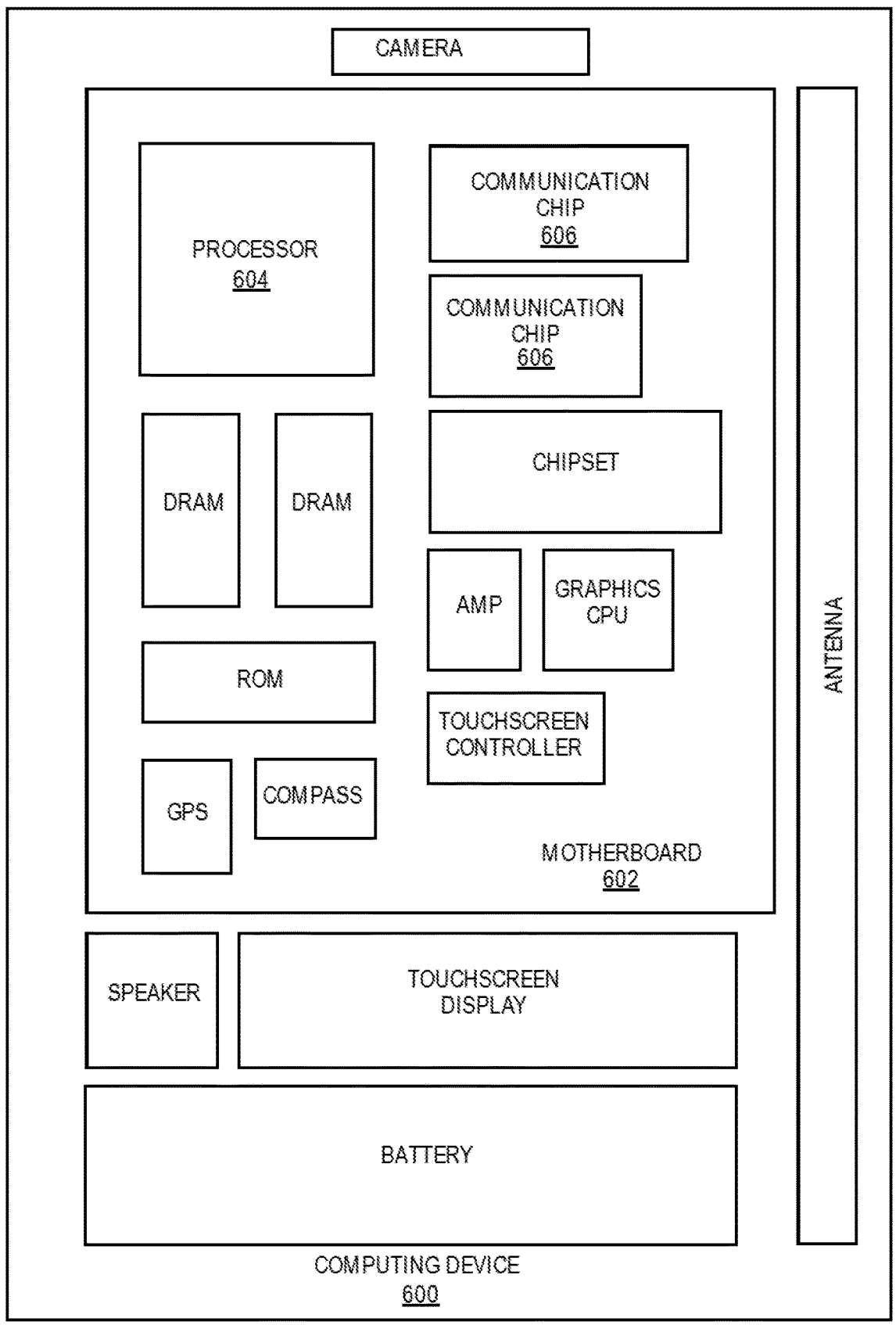
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor includes a DRAM cell formed in the BEOL stack, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip includes a DRAM cell formed in the BEOL stack, as described herein.

In further implementations, another component housed within the computing device 600 may contain an integrated circuit die that includes a DRAM cell formed in the BEOL stack, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
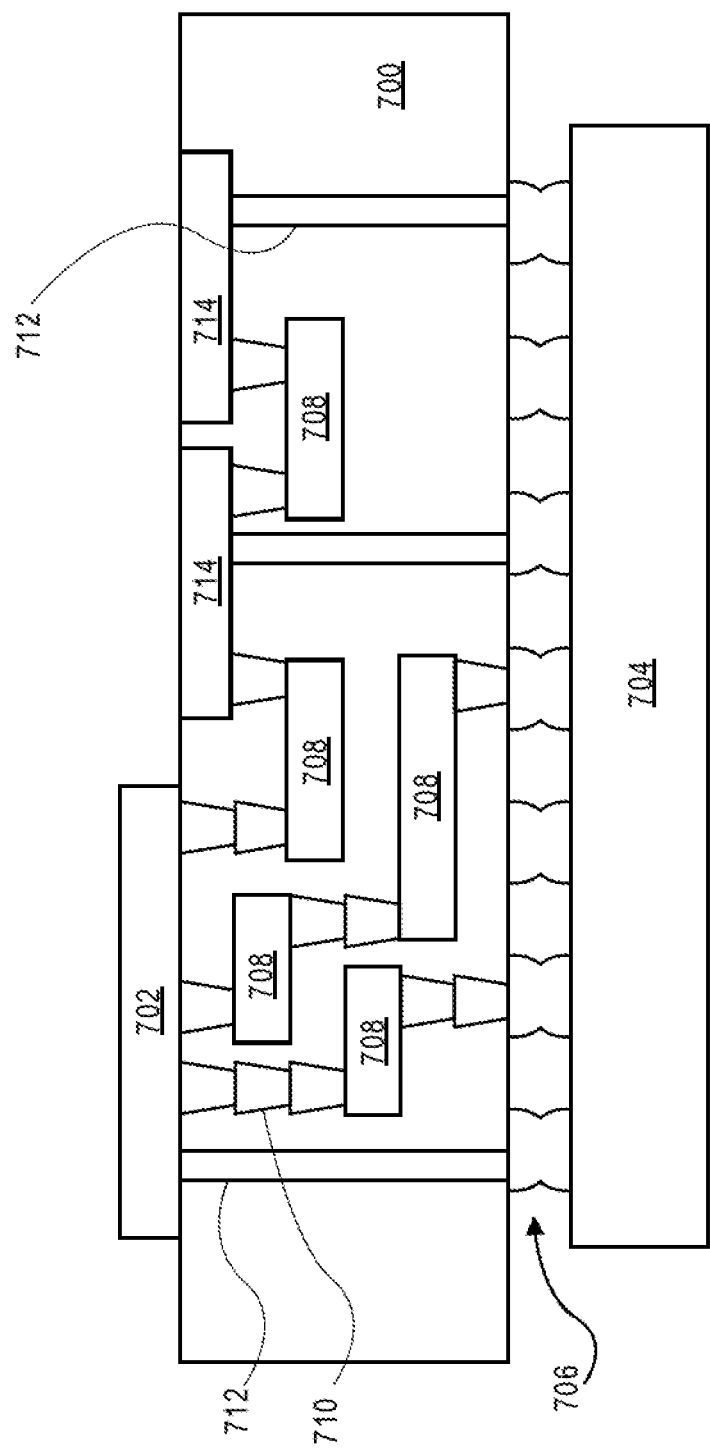
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure include a DRAM cell formed in the BEOL stack, as described herein, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor device, comprising: a gate electrode; a gate dielectric surrounding the gate electrode; a source region below the gate electrode; a drain region above the gate electrode; a channel region between the source region and the drain region, wherein the channel region is separated from a sidewall of the gate electrode by the gate dielectric; and a capacitor electrically coupled to the drain region.

Example 2: the transistor device of Example 1, wherein the capacitor is comprises an interdigitated interface between a capacitor storage node and top electrode.

Example 3: the transistor device of Example 1 or Example 2, wherein the gate dielectric has a non-uniform thickness around the gate electrode.

Example 4: the transistor device of Examples 1-3, wherein a thickness of the gate dielectric below the gate electrode is greater than a thickness of the gate dielectric above the gate electrode.

Example 5: the transistor device of Examples 1-4, wherein a thickness of the source region is greater than a thickness of the drain region.

Example 6: the transistor device of Examples 1-5, wherein a surface of the channel opposite the gate dielectric is in contact with sealant layer.

Example 7: the transistor device of Examples 1-6, wherein the sealant layer is a bilayer.

Example 8: the transistor device of Examples 1-7, wherein the gate electrode comprises a stack of conductive materials.

Example 9: the transistor device of Examples 1-8, wherein the gate dielectric comprises a multi-layer stack.

Example 10: the transistor device of Examples 1-9, wherein the transistor device is in one or more interlayer dielectric (ILD) layers over a semiconductor substrate.

Example 11: a dynamic random access memory (DRAM) cell, comprising: a plurality of wordlines in a first interlayer dielectric (ILD); a plurality of bitlines in a second ILD above the first ILD; a plurality of vertically oriented transistors, wherein a source of each transistor is electrically coupled to one of the plurality of bitlines, and wherein a gate of each transistor is electrically coupled to one of the plurality of wordlines; and a plurality of capacitors, wherein each of the plurality of capacitors is electrically coupled to a drain of one of the plurality of transistors.

Example 12: the DRAM cell of Example 11, wherein one or more sensing circuits for the DRAM cell are below the DRAM cell on an underlying semiconductor substrate.

Example 13: the DRAM cell of Example 11 or Example 12, wherein the one or more sensing circuits are within the footprint of the DRAM cell.

Example 14: the DRAM cell of Examples 11-13, wherein the plurality of capacitors each comprise an interdigitated interface between a capacitor storage node and top electrode.

Example 15: the DRAM cell of Examples 11-14, wherein the capacitors share a single top electrode.

Example 16: the DRAM cell of Examples 11-15, wherein the gate electrode of each transistor is surrounded by a gate dielectric, and wherein a channel between the source and the drain is separated from a sidewall of the gate electrode by the gate dielectric.

Example 17: the DRAM cell of Examples 11-16, wherein the channel is in contact with a sealant layer.

Example 18: the DRAM cell of Examples 11-17, wherein the sealant layer is a bilayer.

Example 19: the DRAM cell of Examples 11-18, wherein drain of each transistor is electrically coupled to the capacitor by a metal sealant layer.

Example 20: the DRAM cell of Examples 11-19, wherein a thickness of the gate dielectric layer is non-uniform.

Example 21: the DRAM cell of Examples 11-20, wherein a thickness of the gate dielectric layer below the gate electrode is greater than a thickness of the gate dielectric layer above the gate electrode.

Example 22: the DRAM cell of Examples 11-21, wherein the gate electrode comprises a stack of conductive materials.

Example 23: the DRAM cell of Examples 11-22, wherein the gate dielectric comprises a multi-layer stack.

Example 24: a memory device, comprising: a semiconductor substrate; a plurality of interlayer dielectrics (ILDs) above the semiconductor substrate; a dynamic random access memory (DRAM) cell integrated into the plurality of ILDs; and a sensing circuit electrically coupled to the DRAM cell, wherein the sensing circuit is on the semiconductor substrate below the DRAM cell.

Example 25: the memory device of Example 24, wherein the sensing circuit is within a footprint of the DRAM cell.

What is claimed is:

1. A transistor device, comprising:
   a gate electrode;
   a gate dielectric surrounding the gate electrode;
   a semiconductor layer, the semiconductor layer continuous from a location above a top of the gate electrode that vertically overlaps with the top of the gate electrode, along sidewalls of the gate electrode, and to a location below a bottom of the gate electrode that vertically overlaps with the bottom of the gate electrode;
   a source region below the gate electrode;
   a drain region above the gate electrode;
   a channel region between the source region and the drain region, wherein the channel region is separated from a sidewall of the gate electrode by the gate dielectric, and wherein at least a portion of the channel region is in the semiconductor layer; and
   a capacitor electrically coupled to the drain region.

2. The transistor device of claim 1, wherein the capacitor is comprises an interdigitated interface between a capacitor storage node and top electrode.

3. The transistor device of claim 1, wherein the gate dielectric has a non-uniform thickness around the gate electrode.

4. The transistor device of claim 3, wherein a thickness of the gate dielectric below the gate electrode is greater than a thickness of the gate dielectric above the gate electrode.

5. The transistor device of claim 1, wherein a thickness of the source region is greater than a thickness of the drain region.

6. The transistor device of claim 1, wherein a surface of the channel opposite the gate dielectric is in contact with sealant layer.

7. The transistor device of claim 6, wherein the sealant layer is a bilayer.

8. The transistor device of claim 1, wherein the gate electrode comprises a stack of conductive materials.

9. The transistor device of claim 1, wherein the gate dielectric comprises a multi-layer stack.

10. The transistor device of claim 1, wherein the transistor device is in one or more interlayer dielectric (ILD) layers over a semiconductor substrate.

11. The transistor device of claim 1, wherein the semiconductor semiconductive layer comprises an oxide semiconductor material.

12. The transistor device of claim 1, wherein the semiconductor layer comprises a III-V material.

* * * * *